United States Patent [19]
Chen et al.

[11] Patent Number: 5,762,750
[45] Date of Patent: Jun. 9, 1998

[54] MAGNETIC NEUTRAL LINE DISCHARGED PLASMA TYPE SURFACE CLEANING APPARATUS

[75] Inventors: Wei Chen; Takeshi Sunada; Masahiro Itoh; Hideki Fujimoto; Taijiro Uchida, all of Chigasaki, Japan

[73] Assignee: Nihon Shinku Gijutsu Kabushiki Kaisha, Japan

[21] Appl. No.: 851,614

[22] Filed: May 6, 1997

[30] Foreign Application Priority Data

May 15, 1996 [JP] Japan .................................. 8-120447

[51] Int. Cl.$^6$ ...................................................... H05H 1/00
[52] U.S. Cl. .................. 156/345; 118/723 E; 118/723 I; 204/298.37; 438/905; 134/1.1
[58] Field of Search .................. 156/345; 118/723 E, 118/723 I; 204/298.37; 438/905; 134/1.1

[56] References Cited

U.S. PATENT DOCUMENTS 5,514,246   5/1996   Blalock ............................ 134/1.1 X Primary Examiner—Thi Dang
Attorney, Agent, or Firm—Larson & Taylor

[57] ABSTRACT

A surface cleaning apparatus using magnetic neutral line discharged plasma for the purpose of inner-wall surface cleaning of a vacuum vessel assembled in a semiconductor manufacturing machine, which comprises electromagnetic coils for producing a closed magnetic neutral line that is formed by circularly connecting points of zero-intensity magnetic field, rf electric field generator for continuously generating plasma by applying a rf electric field along the magnetic neutral line and a controller for controlling the size and position of the closed magnetic neutral line and the kind, temperature and density of the plasma being generated.

4 Claims, 2 Drawing Sheets

MAGNETIC NEUTRAL LINE DISCHARGED PLASMA TYPE SURFACE CLEANING APPARATUS

BACKGROUND OF THE INVENTION

1. Field of the Invention

The present invention relates to a magnetic neutral line discharged plasma type cleaning apparatus adapted to carrying out a surface cleaning operation by utilizing magnetic neutral line discharged plasma being used for coating, etching, sputtering, ashing, CVD or some other operation on an object to be treated such as a substrate or a target in a semiconductor manufacturing process.

2. Prior Art

In the operation of processing a wafer arranged in an vacuum chamber evacuated to a high degree of vacuum by introducing gaseous substances sequentially or as a mixture thereof in the manufacture of semiconductor devices, some of the unnecessary reaction by-products that are either solid or gas adhere more or less to the surface of the wafer and that of the vacuum chamber. Of these, powdery by-products that are referred to as particles provide a problem that has to be solved in the semiconductor manufacturing industry.

Another problem arises when the processed wafer is taken out and an unprocessed wafer is placed in the vacuum chamber because the contaminants adhering to the inner wall surface of the vacuum chamber can get into the operation of processing the new wafer to make the effect of the processing operation variable as a function of the contaminants.

In practice, the vacuum chamber is cleansed periodically after processing a given number of wafers either with a liquid cleanser or by means of so-called discharge cleaning. Discharge cleaning is an operation of generating ions, electrons or excited atoms by electric discharge in a gaseous substance and causing them to collide with the inner wall surface of the chamber to remove the contaminants adhering to the inner wall surface of the vacuum chamber with or without a chemical reaction. However, there is no way of controlling the interaction between the inner wall surface and the electric discharge, using microwaves in particular, in the operation of discharge cleaning except by seeing the expansion and diffusion of plasma and relying on experience.

On the floor of manufacturing semiconductor devices, the inside of the vacuum chamber that has been contaminated by various processing operations needs to be cleansed quickly and, therefore, the technique to be used for the cleaning operation takes a vital role in the manufacture along with the processing techniques used there.

Particularly in the case of a process involving the use of chemical reaction such as etching or CVD, the time required for a cleaning operation currently provides a serious problem that has to be dissolved against curtailing the time.

It is therefore an object of the present invention to provide a magnetic neutral line discharged plasma type surface cleaning apparatus that utilizes magnetic neutral line discharge plasma being used on an object to be treated such as a substrate or a target in a semiconductor manufacturing process.

SUMMARY OF THE INVENTION

According to the invention, the above object is achieved by providing a magnetic neutral line discharged plasma type surface cleaning apparatus comprising means for producing a closed magnetic neutral line to be formed by circularly connecting points of zero-intensity magnetic field, means for continuously generating plasma by applying a rf-electric field along the magnetic neutral line and control means for controlling the size and position of the closed magnetic neutral line and the kind, temperature and density of the plasma being generated.

Said control means may comprise an excitation control unit for controlling the excitation of the means for producing a closed magnetic neutral line in such a way that at least a pair of lines of magnetic force crossing the magnetic neutral line are connected with each other off the magnetic neutral line while all remaining pairs of lines of magnetic force crossing the magnetic neutral line are leaving from the magnetic neutral line toward up and down in a plane perpendicular to the magnetic neutral line.

Said control means may additionally control the excitation of the means for producing a closed magnetic neutral line in such a way that at least a pair of lines of magnetic force crossing the magnetic neutral line are connected with each other off the magnetic neutral line, while all remaining pairs of lines of magnetic force crossing the magnetic neutral line are leaving from the magnetic neutral line toward up and down in a plane perpendicular to the magnetic neutral line, and the connected lines of magnetic force either penetrate or contact the inner wall of the vacuum chamber when the size of the magnetic neutral line is modified.

Said control means may comprise a high frequency power control unit for controlling the high frequency power to be applied into said means for continuously generating plasma to control the characteristics of plasma being generated.

Magnetic neutral line discharge plasma is very special in that the point of plasma generation can be defined spatially. If, in particular, the magnetic neutral line is symmetric and closed, at least a pair of lines of magnetic force crossing the magnetic neutral line can be connected with each other off the magnetic neutral line, while all remaining pairs of lines of magnetic force crossing the magnetic neutral line are leaving from the magnetic neutral line toward up and down in a plane perpendicular to the magnetic neutral line, so that the connected lines of magnetic force either penetrate or change the point of contact on the inner wall of the vacuum chamber when the size of the magnetic neutral line is modified, keeping the symmetry of the line, and ions or electrons flying out from the plasma generated on the magnetic neutral line along the lines of magnetic force collide with the inner wall surface of the vacuum chamber. A surface cleaning apparatus according to the invention can cleanse the entire inner wall surface of the vacuum chamber in a controlled manner by utilizing this phenomenon.

DETAILED DESCRIPTION OF THE INVENTION

Now, the invention will be described further by referring to the accompanying drawings that illustrate a preferred embodiment of the invention.

Figure 1:
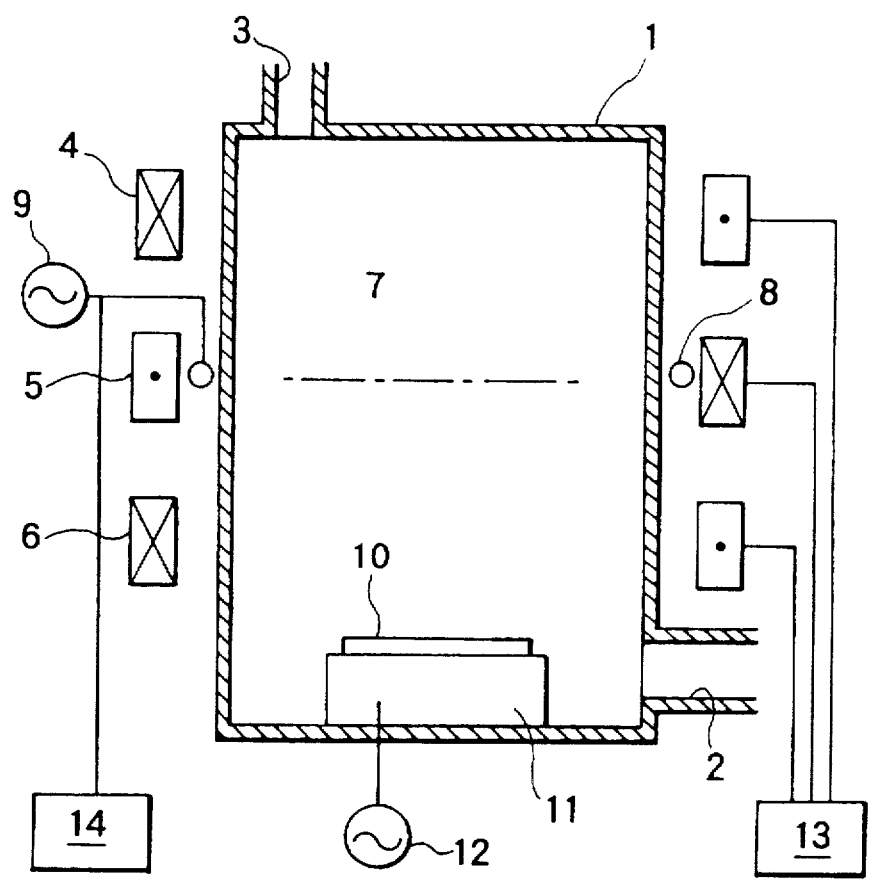
FIG. 1 is a schematic longitudinal cross sectional view of an embodiment of magnetic neutral line discharged plasma type surface cleaning apparatus according to the invention.

FIG. 1 is a schematic longitudinal cross sectional view of an embodiment of magnetic neutral line discharged plasma type surface cleaning apparatus according to the invention. Referring to FIG. 1, there are shown a cylindrical vacuum chamber 1 made of dielectric material provided with an exhaust port 2 at a lower position thereof and a gas inlet port 3 at the top thereof and solenoids 4 through 6 arranged to produce a magnetic neutral line 7 by circularly connecting points of zero-intensity magnetic field. The solenoids 4 and 6 have a clockwise winding whereas the solenoid 5 has a counterclockwise winding, all of which are arranged outside the peripheral wall of the dielectric vacuum chamber 1. A plasma generating high frequency coil 8 is wound between the middle solenoid 5 and the outer peripheral surface of the vacuum chamber 1 and connected to a high frequency power source 9. Otherwise, there are shown a wafer 10 and a table 11 on which the wafer 10 is mounted. The table 11 is connected to another high frequency power source 12.

Reference numerals 13 and 14 respectively denotes an excitation control unit for the solenoids 4 through 6 and a control unit for the high frequency power source 9 of the plasma generating high frequency coil 8.

In the apparatus having a configuration as described above, a plasma etching operation is carried out by connecting the plasma generating high frequency coil 8 to the high frequency power source 9 and the table 11 to the other high frequency power source 12 to feed power from the two sources.

Now, the operation of the apparatus for cleaning the vacuum chamber will be described by referring to FIGS. 2a through 2c.

Figure 2A:
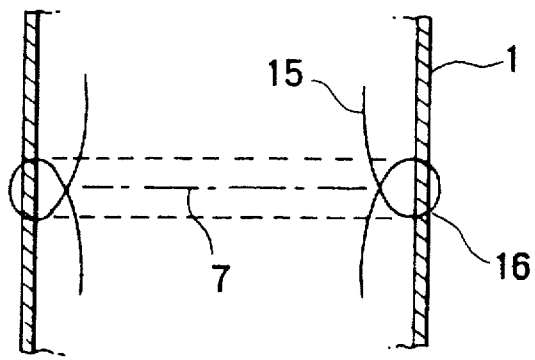
FIGS. 2a, 2b and 2c are schematic views illustrating the operation of the above embodiment of magnetic neutral line discharged plasma type surface cleaning apparatus according to the invention.
Figure 2B:
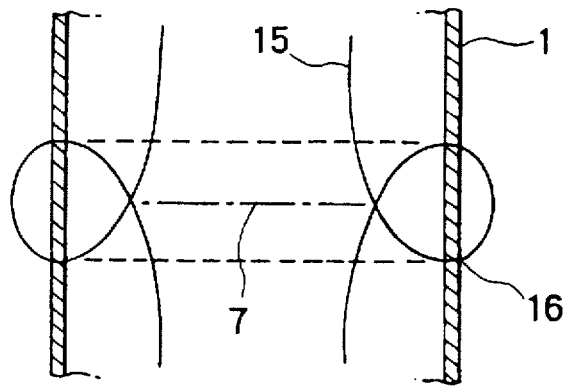
Figure 2C:
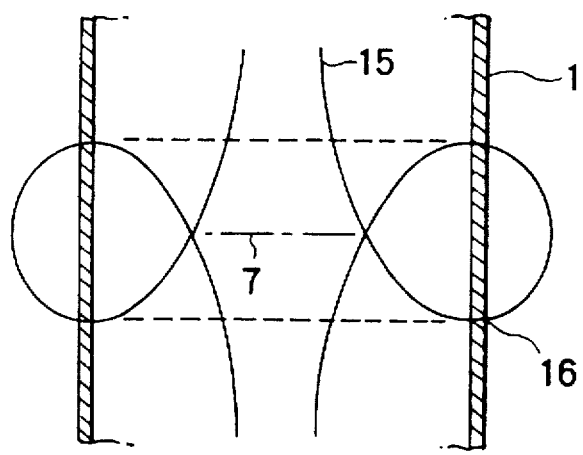

FIGS. 2a through 2c schematically illustrate how magnetic neutral line discharged plasma is used to cleanse the inner wall surface of the cylindrical vacuum chamber 1. In these illustrations, the cylindrical vacuum chamber 1 is shown in longitudinal cross section. Each line of magnetic force 15 penetrates the vacuum chamber 1 at points 16. Reference numeral 7 denotes a magnetic neutral line.

The diameter of the magnetic neutral line 7 may be reduced from FIG. 2a to FIG. 2b and then to FIG. 2c. Then, the points of penetration 16 of the line of magnetic force 15 that crosses on the magnetic neutral line 7 vertically move away from each other. Thus, if the diameter and the length of the cylindrical dielectric vacuum chamber 1 are selected appropriately, the penetration points may get to anywhere not only on the inner wall surface of the vacuum chamber but also on the top and the bottom of the vacuum chamber 1.

Therefore, many of the charge carrying bodies of the plasma generated on the magnetic neutral line may move along the above described line of magnetic force to get to anywhere on the inner wall surface of the cylindrical vacuum chamber 1 so that the inner wall of the vacuum chamber can be cleansed in a very short period of time by appropriately defining the rate of change of the diameter of the magnetic neutral line so that the speed of vertically moving points of penetration depending on the level of contamination of the inner wall of the cylindrical vacuum chamber 1 and also by appropriately selecting gases to be used in the chamber and the rates of introducing the respective gases.

In an experiment conducted to see the effect of the present invention, a hundred $SiO_2$ wafer specimens were tested in a high speed etching process, using different gases including $C_3F_8$ and $C_4F_8$, and the cleansing effect of a known appratus using IPC plasma and that of the above embodiment using magnetic neutral line discharge plasma were compared at the time when the crystal window arranged on the outer wall of the vacuum chamber to monitor the inside recovers its transparency. As a result, it was found that the magnetic neutral line discharge took a very short time until the transparency of the window is recovered, which was less than 1/6 of the time required for IPC plasma, to prove that a magnetic neutral line discharged plasma type surface cleaning apparatus according to the invention operates excellently.

As described above, a magnetic neutral line discharged plasma type surface cleaning apparatus according to the invention can cleanse the inner wall of a vacuum chamber by means of magnetic neutral line discharge plasma. It can particularly advantageously be used after a surface treatment operation of any type conducted on wafers and liquid crystal in order to cleanse the inner wall surface of the vacuum chamber effectively and efficiently in a very short period of time.

It should be noted here that, while magnetic neutral line discharged plasma itself is effective for surface treatment, any other techniques of surface treatment can feasibly be used for the purpose of the invention.

We claim:

1. A magnetic neutral line discharged plasma type surface cleaning apparatus comprising means for producing a closed magnetic neutral line which is formed by connecting points of zero-intensity magnetic field, means for continuously generating plasma by applying a rf electric field along the magnetic neutral line and control means for controlling the size and position of the closed magnetic neutral line and the kind, temperature and density of the plasma being generated.

2. A magnetic neutral line discharged plasma type surface cleaning apparatus according to claim 1, wherein said control means comprises an excitation control unit for controlling the excitation of the means for producing a closed magnetic neutral line in such a way that at least a pair of lines of magnetic force crossing the magnetic neutral line are connected with each other off the magnetic neutral line while all remaining pairs of lines of magnetic force crossing the magnetic neutral line are leaving from the magnetic neutral line toward up and down in a plane perpendicular to the magnetic neutral line.

3. A magnetic neutral line discharged plasma type surface cleaning apparatus according to claim 2, wherein said control means additionally controls the excitation of the means for producing a closed magnetic neutral line in such a way that at least a pair of lines of magnetic force crossing the magnetic neutral line are connected with each other off the magnetic neutral line, while all remaining pairs of lines of magnetic force crossing the magnetic neutral line are leaving from the magnetic neutral line toward up and down in a plane perpendicular to the magnetic neutral line, and the connected lines of magnetic force either penetrate or contact the inner wall of the vacuum chamber when the size of the magnetic neutral line is modified.

4. A magnetic neutral line discharged plasma type surface cleaning apparatus according to claim 1, wherein said control means comprises a high frequency power control unit for controlling the high frequency power to be applied into said means for continuously generating plasma to control the characteristics of plasma being generated.

* * * * *